United States Patent
Yasuda

(10) Patent No.: US 6,529,534 B1
(45) Date of Patent: Mar. 4, 2003

(54) WAVELENGTH CONTROLLING CIRCUIT FOR LASER SIGNAL

(75) Inventor: Norihiro Yasuda, Tokyo (JP)

(73) Assignee: NEC Corporation (JP)

(*) Notice: Subject to any disclaimer, the term of this patent is extended or adjusted under 35 U.S.C. 154(b) by 0 days.

(21) Appl. No.: 09/249,240

(22) Filed: Feb. 11, 1999

(30) Foreign Application Priority Data

Feb. 27, 1998 (JP) .......................................... 10-047807

(51) Int. Cl.[7] ................................................ H01S 3/13
(52) U.S. Cl. .............................. 372/32; 372/20; 372/34
(58) Field of Search .......................... 372/20, 26, 38.1, 372/38.02, 38.03, 29.011, 29.015, 29.02, 32, 34–36, 38.01, 38.07

(56) References Cited

U.S. PATENT DOCUMENTS

| | | | | |
|---|---|---|---|---|
| 4,821,273 A | * | 4/1989 | Hori .......................... | 372/31 |
| 4,947,398 A | * | 8/1990 | Yasuda et al. ................ | 372/29 |
| 5,438,579 A | * | 8/1995 | Eda et al. ..................... | 372/34 |
| 5,696,859 A | * | 12/1997 | Onaka et al. ................. | 385/24 |
| 5,781,572 A | * | 7/1998 | Tahara et al. ................. | 372/34 |
| 6,040,931 A | * | 3/2000 | Miyazaki et al. ........... | 359/110 |
| 6,154,474 A | * | 11/2000 | Yoshida ....................... | 372/38 |
| 6,212,210 B1 | * | 4/2001 | Serizawa ..................... | 372/32 |

FOREIGN PATENT DOCUMENTS

| | | |
|---|---|---|
| EP | 0818857 | 1/1998 |
| JP | 62-244184 | 10/1987 |
| JP | 6-310796 | 11/1994 |
| JP | 7-249817 | 9/1995 |
| JP | 7-302948 | 11/1995 |
| JP | 8-18145 | 1/1996 |
| JP | 8-37334 | 2/1996 |
| JP | 8-139396 | 5/1996 |
| JP | 9-219554 | 8/1997 |

OTHER PUBLICATIONS

European Search Report issued Mar. 12, 2001 in a related application (in English).
Patent Abstracts of Japan, vol. 012, No. 403 (E–674), Oct. 26, 1988 & JP 63143888 A (Yokogawa Electric Corp), Jun. 16, 1988, *abstract; figures 1,2*.
Patent Abstracts of Japan, vol. 1996, No. 05, May 31, 1996 & JP 08–018145 A (Olympus Optical Co. Ltd.), Jan. 19, 1996, *the whole document*.
Japanese Office Action issued Feb. 24, 2001 in a related application with English translation of relevant portions.

* cited by examiner

Primary Examiner—Paul Ip
Assistant Examiner—Davienne Monbleau
(74) Attorney, Agent, or Firm—Dickstein, Shapiro, Morin & Oshinsky, LLP.

(57) ABSTRACT a wavelength controlling circuit for a laser signal of the present invention can set a laser signal to a target wavelength readily upon wavelength control of the laser signal and eliminates the problem of a drift. As shown in FIG. 3, the wavelength controlling circuit for a laser signal includes a laser diode module (3) including a semiconductor laser diode (31), a temperature detection element (32) and a temperature adjustment element (33), wavelength controlling means including an optical band-pass filter (42) used as a wavelength discrimination element for controlling the wavelength of a laser signal within a range of fine adjustment within which the wavelength can be discriminated by the optical band-pass filter, and temperature controlling means for adjusting, when the wavelength of the laser signal is outside the range within which the wavelength can be discriminated with a wavelength discrimination characteristic by the optical band-pass filter, the wavelength of the laser signal roughly so that the wavelength may be included in the discrimination allowing range.

11 Claims, 3 Drawing Sheets

WAVELENGTH CONTROLLING CIRCUIT FOR LASER SIGNAL

BACKGROUND OF THE INVENTION

1. Field of the Invention

This invention relates to a laser wavelength controlling circuit for controlling the wavelength of laser light, and more particularly to a wavelength controlling circuit for a laser signal having a rough adjustment function of an oscillation wavelength of laser light.

2. Description of the Relates Art

Investigations of a wavelength multiplex method as an optical transmission system are performed energetically at present, and a demand for a technique for transmitting many wavelength signals is increasing. However, the wavelength band of a signal which can be used by an optical amplifier is restricted, and in order to allow the restricted wavelength band to have a number of channels as great as possible, it is necessary to narrow the wavelength interval and stabilize the oscillation frequency of a laser signal with a high degree of accuracy.

Conventionally, as a method of stabilizing the oscillation frequency of a laser signal of an optical transmitter, a method of controlling the temperature of a laser module is used. For example, according to Japanese Patent Laid-Open No. 302948/1995, a wavelength stabilization apparatus is disclosed wherein, as shown in FIG. 1, temperature sensor 20 and Peltier element 22 are disposed in the proximity of semiconductor laser 14, and temperature controller 26 which drives Peltier element 22 in response to an output of temperature sensor 20 is provided. Further, polarizing beam splitter 28, ¼ wavelength plate 32, etalon 34 and photodiode 36 are disposed in order in front of light source unit 12, and current controller 38 which supplies inrush current to semiconductor laser 14 in response to an output from photodiode 36 is provided to stabilize the wavelength of light to be emitted.

Meanwhile, according to Japanese Patent Laid-Open No. 37334/1996, a laser wavelength controlling apparatus is disclosed wherein, as shown in FIG. 2, laser diode 42 and Peltier effect element 41 which controls the temperature of laser diode 42 are disposed in LD module 43. Laser light 45 generated from LD module 43 is introduced into optical narrow band high-pass filter 46 and optical narrow band low-pass filter 51, and transmission light through them is detected by photodiodes 48, 53, respectively. Filters 46, 51 transmit light components at wavelength positions displaced a little by an equal wavelength to the longer wavelength side and the shorter wavelength side from a desired oscillation center wavelength of the laser light. Accordingly, if Peltier effect element 41 is controlled by temperature adjustment circuit 58 so that the light components detected by photodiodes 48, 53 may be equal to each other, the laser light can be set to the desired oscillation center frequency.

However, the former wavelength stabilization apparatus has a problem in that, even if the temperature is controlled to a fixed value, the wavelength suffers from a drift by secular degradation of the semiconductor laser or the temperature sensor.

Meanwhile, with the latter laser wavelength controlling apparatus, although it is improved against a drift of the wavelength by secular degradation of the laser diode or the temperature sensor, it is not easy to set it to an intended wavelength.

SUMMARY OF THE INVENTION

It is an object of the present invention to provide a wavelength controlling circuit for a laser signal which can set a laser signal to a target wavelength readily upon wavelength control of the laser signal and eliminates the problem of a drift.

According to an aspect of the present invention, a wavelength controlling circuit for a laser signal comprises a laser diode module including a semiconductor laser diode, a temperature detection element and a temperature adjustment element, wavelength controlling means including an optical band-pass filter used as a wavelength discrimination element for controlling the wavelength of a laser signal within a range of fine adjustment within which the wavelength can be discriminated by the optical band-pass filter, and temperature controlling means for adjusting, when the wavelength of the laser signal is outside the range within which the wavelength can be discriminated with a wavelength discrimination characteristic by the optical band-pass filter, the wavelength of the laser signal roughly so that the wavelength may be included in the discrimination allowing range.

According to another aspect of the present invention, a wavelength controlling circuit for a laser signal comprises a laser diode including a semiconductor laser diode, a temperature detection element and a temperature adjustment element, monitoring means including an element which branches part of a laser signal output of the semiconductor laser diode and a wavelength discrimination element for monitoring the wavelength of the laser signal, first adjustment means for generating a signal for finely adjusting the wavelength of the laser signal in response to an output from the monitoring means, second adjustment means for generating a signal for roughly adjusting the wavelength of the laser signal in response to a result of monitoring of the temperature which is monitored by the temperature detection element of the laser diode module, switching means for discriminating, in response to the result of the temperature monitoring of the laser diode module, that a predetermined wavelength is reached and performing switching from the second adjustment means to the first adjustment means, and driving means for driving the temperature adjustment element of the laser diode module with the adjustment signals of the first and second adjustment means.

According to a further aspect of the present invention, a wavelength controlling circuit for a laser signal comprises a laser diode including a semiconductor laser diode, a temperature detection element and a temperature adjustment element, an element for branching part of a laser signal output from the semiconductor laser diode, a wavelength monitoring circuit including a beam splitter for splitting the branched laser signal into two laser signals, an optical band-pass filter having a different transmission factor of an optical wavelength for receiving one of the split laser signals, a first optical detector for receiving the laser signal having transmitted through the optical band-pass filter, and a second optical detector for receiving the other of the split laser signals, the wavelength monitoring circuit monitoring a range within which the wavelength of the laser signal can be discriminated by the optical band-pass filter, a first controlling circuit for generating a signal for finely adjusting the wavelength of the laser signal, the first controlling circuit including a divider for dividing an output from the second optical detector of the wavelength monitoring circuit by an output from the first optical detector and a first amplifier for amplifying a difference voltage between an output signal from the divider and a first reference voltage, a second controlling circuit for generating a signal for roughly adjusting the wavelength of the laser signal so that the wavelength of the laser signal may come within a discrimination allowing range, the second controlling circuit including a temperature monitoring circuit connected to a thermistor of the laser diode module for detecting a voltage signal proportional to the temperature after operation is started and a second amplifier for amplifying a difference between an output from the temperature monitoring circuit and a second reference voltage, a switching circuit for performing switching from the second controlling circuit which roughly adjusts the wavelength of the laser signal to the first controlling circuit which finely adjusts the wavelength of the laser signal, the switching circuit including a comparison circuit for receiving the voltage proportional to the temperature by the rough adjustment of the wavelength of the laser signal and generating an activation signal with a predetermined voltage and a switch which operates in response to the activation signal of the comparison circuit, and a driving circuit for driving the temperature adjustment element of the laser diode module with the fine adjustment signal of the first controlling circuit.

With the present invention, there is an effect that a wavelength drift by secular degradation of a semiconductor laser or secular change of a thermistor is eliminated. The reason is that, as a method of directly detecting and feeding back the wavelength of a laser signal, a wavelength monitor module which makes use of a transmission characteristic of an optical filter is used for control.

Further, with the present invention, whatever the ambient temperature or the like upon starting of control is, the wavelength can be initially set to a value within a control allowing range and wavelength control of a high degree of reliability can be achieved without a malfunction. The reason is that the two controlling circuits of a wavelength controlling circuit and a temperature controlling circuit wherein an optical band-pass filter is used as a wavelength discrimination element are included.

Accordingly, from the reasons described above, the present invention has an effect that the full width at half minimum of the optical band-pass filter can be narrowed and wavelength control of a high degree of accuracy can be achieved.

DESCRIPTION OF THE PREFERRED EMBODIMENT

An embodiment of the present invention is described in detail with reference to the drawings.

Figure 1:
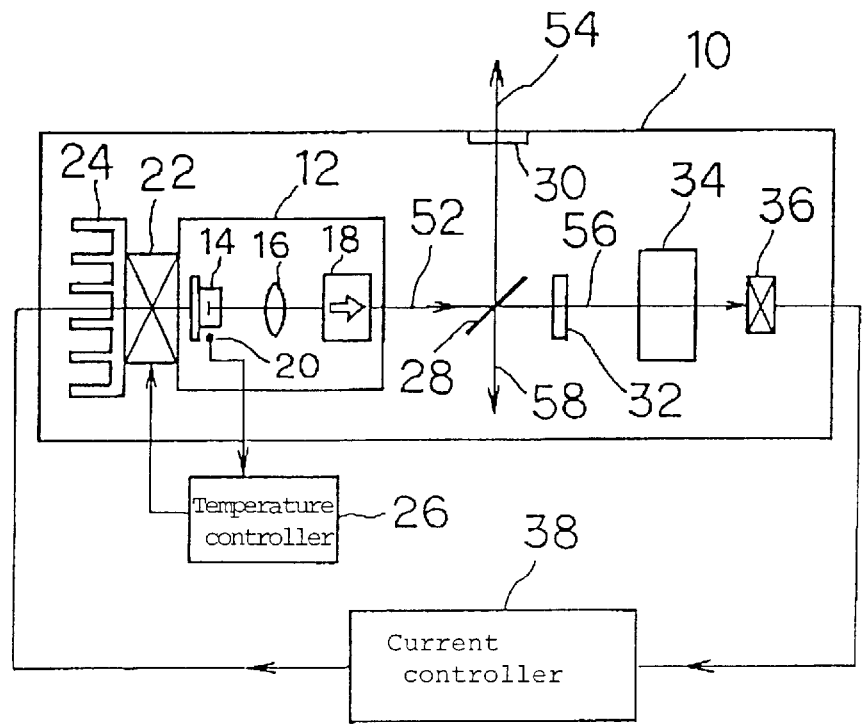
FIG. 1 is a block diagram showing a form of a conventional wavelength controlling circuit for a laser signal.
Figure 2:
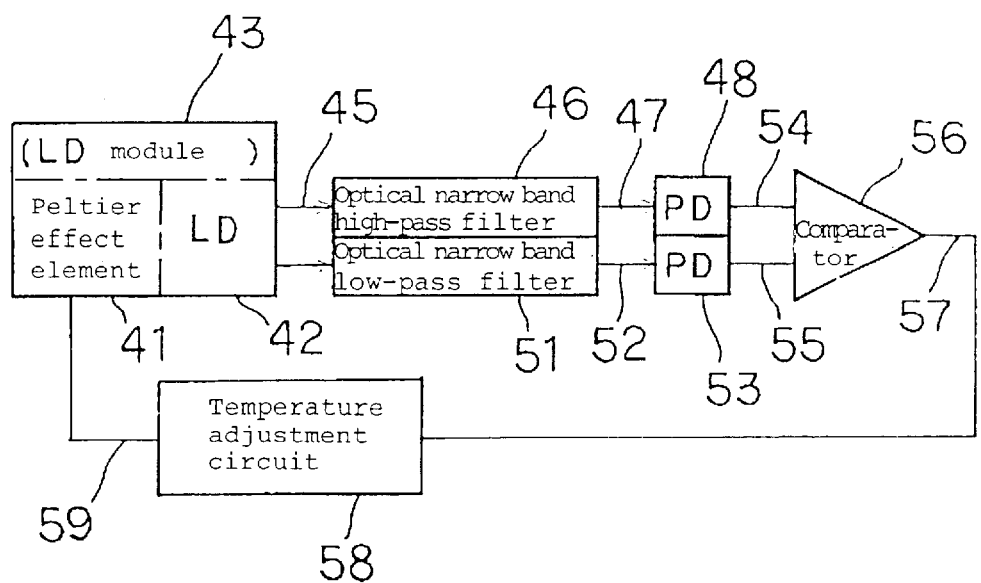
FIG. 2 is a block diagram showing a form of another conventional wavelength controlling circuit for a laser signal.
Figure 3:
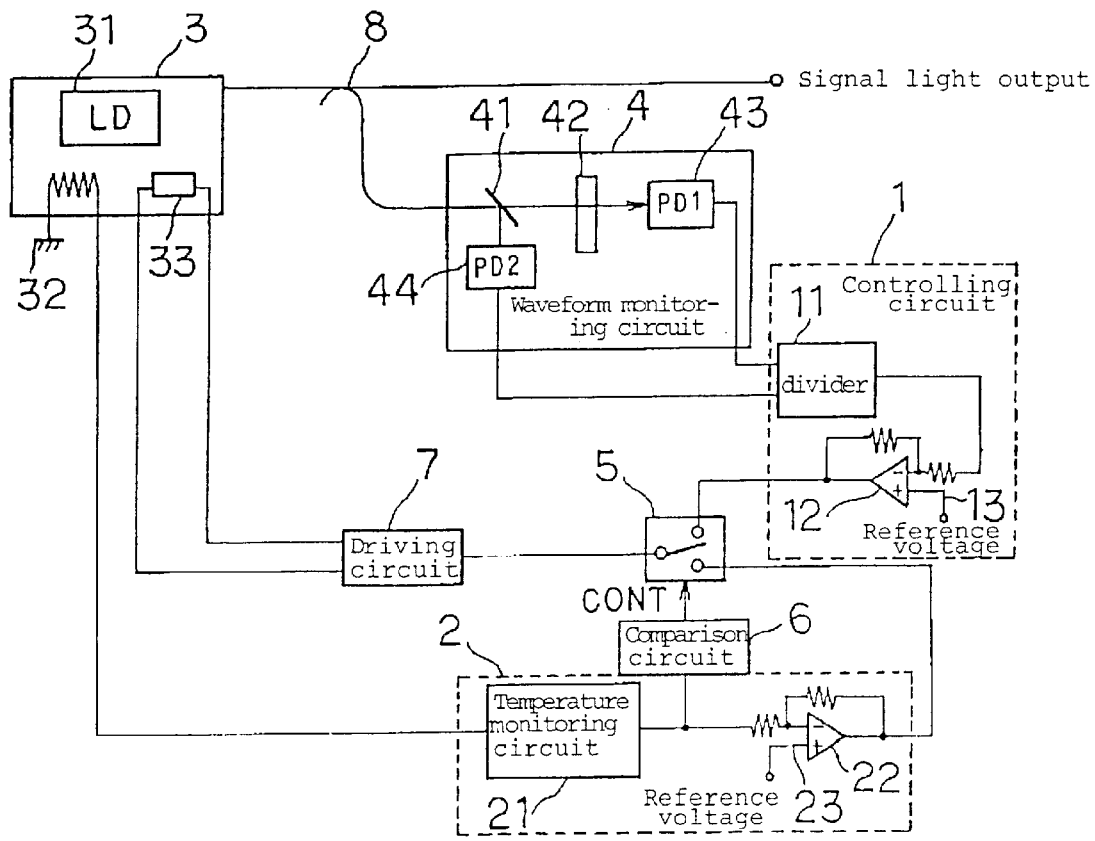
FIG. 3 is a block diagram showing an embodiment of a wavelength controlling circuit for a laser signal according to the present invention.

FIG. 3 is a block diagram showing an embodiment of a wavelength controlling circuit for a laser signal of the present invention. In the present embodiment, an output beam from laser diode module 3 is branched into two beams by light branching coupler 8, and one of the two beams is generated as a laser signal while the other beam is applied to waveform monitoring circuit 4. In waveform monitoring circuit 4, the applied laser signal beam is branched into two beams by beam splitter 41, and one of the beams is received by optical detector 44 while the other beam is received by optical detector 43 through optical band-pass filter 42 which exhibits a different transmission factor for a different wavelength of light. An output from optical detector 43 and an output from optical detector 44 are applied to divider 11 provided in controlling circuit 1, and divider 11 divides the output from optical detector 43 by the output from optical detector 44 to detect a division value. An output signal from divider 11 is applied to amplifier 12, by which a difference voltage of it from reference voltage 13 is amplified, and the amplified difference voltage is enerated as an output signal from controlling circuit 1. laser diode module 3 includes semiconductor laser 31, thermistor 32 having a resistance value which varies depending upon the temperature, and Peltier element 33 which heats/cools depending upon the direction of current therethrough. One of two terminals of thermistor 32 is grounded while the other terminal is connected to temperature monitoring circuit 21 provided in controlling circuit 2 so that a voltage signal proportional to the temperature is detected by temperature monitoring circuit 21. An output from temperature monitoring circuit 21 is applied to amplifier 22 and comparison circuit 6. Amplifier 22 amplifies a difference of the output from temperature monitoring circuit 21 from reference voltage 23 and generates the amplified difference as an output signal from controlling circuit 2. Output signals from controlling circuit 1 and controlling circuit 2 are applied to analog switch 5. As a control signal for analog switch 5, an output from comparison circuit 6 is connected to analog switch 5, and in response to an output voltage signal from temperature monitoring circuit 21, that is, the temperature of laser diode module 3, one of controlling circuit 1 and controlling circuit 2 is selected by analog switch 5 and applied to driving circuit 7. In response to the voltage signal from controlling circuit 1 or controlling circuit 2, driving circuit 7 supplies current to Peltier element 33 in laser diode module 3 to heat or cool laser diode module 3.

In the present embodiment, a laser diode MQW-DFB-LD having a wavelength of 1.55 $\mu$m is used for laser diode module 3, and a fusion type fiber coupler having a branching ratio of 10:1 is used for light branching coupler 8. Further, in waveform monitoring circuit 4, a beam splitter having a branching ratio of 1:1 is used for beam splitter 41, a dielectric multilayer interference filter having a transmission center wavelength of 1,555 nm and having a full width at half maximum of 1 nm is used for optical band-pass filter 42, and an indium-gallium-arsenic (InGaAs) photodiode having a binding quantum coefficient of 70% is used for optical detectors 43, 44.

Figure 4:
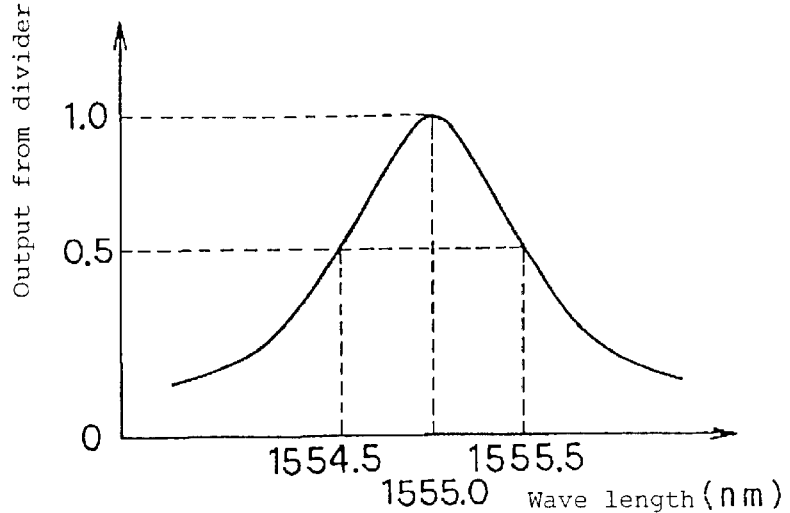
FIG. 4 is a graph illustrating an output characteristic of a divider in the embodiment of the wavelength controlling circuit for a laser signal according to the present invention.

Next, operation of the wavelength controlling circuit for a laser signal of the present invention is described with reference to the drawings. First, the principle of wavelength control of the present invention is described. FIG. 4 illustrates a result of a measurement of a wavelength discrimination characteristic of waveform monitoring circuit 4. The graph represents a division value (1 v corresponds to the ratio 1) when an output from optical detector 43 is divided by an output from optical detector 44 for a wavelength of a laser signal of laser diode module 3, and indicates that a wavelength discrimination characteristic which does not rely upon the applied power is obtained. Since generally the oscillation wavelength of a semiconductor laser has a temperature dependency of approximately 0.1 nm/° C., the oscillation wavelength can be controlled if the wavelength discrimination curve of FIG. 4 is used to control the temperature of the laser so that the division value may be fixed. For example, if a slope of the wavelength discrimination curve on the longer wavelength side is used to set so that the division value may be 0.5 v, that is, to set reference voltage 13 of amplifier 12 to 0.5 v, then the wavelength is controlled to 1,555.5 nm.

The wavelength discrimination characteristic exhibits a higher detection sensitivity with respect to a variation of the wavelength as the full width at half maximum of optical band-pass filter 42 decreases. However, as the full width at half maximum decreases, the range within which the wavelength can be monitored decreases. If it is intended to use the wavelength discrimination characteristic for control, when control is to be started, the wavelength of laser diode module 3 must be initially set to a value in the proximity of the slope of the wavelength discrimination curve which is used for the control.

The present invention is characterized in that initial setting of the wavelength of a laser diode to a value in the proximity of the slope of the wavelength discrimination curve used for wavelength control is realized. Operation of initial setting of the wavelength is described on the premise that, in the present embodiment, the slope of the wavelength discrimination curve of FIG. 4 on the longer wavelength side is used to control the wavelength to 1,555.5 nm as described above.

The wavelength of laser diode module 3 when power supply to the present circuit is made available may possibly be on the shorter wavelength side or on the longer wavelength side of the slope of the wavelength discrimination curve of FIG. 4 depending upon the ambient temperature. If the wavelength of laser diode module 3 is on the shorter wavelength side of the slope, it is necessary to initially set the wavelength of laser diode module 3 to the longer wavelength side of the slope. A detailed procedure therefor is described below.

The oscillation frequency of the semiconductor laser has a temperature dependency of approximately 0.1 nm/° C. as described above, and the temperature and the oscillation frequency of the laser diode chip have a substantially proportional relationship to each other. Therefore, by monitoring the temperature of laser diode module 3, an approximate oscillation frequency of laser diode module 3 can be detected from the temperature. In articular, when power supply to the present circuit is ade available, the temperature of laser diode module 3 s detected by temperature monitoring circuit 21 and it is discriminated from the temperature whether the oscillation frequency is on the shorter wavelength side than the longer wavelength slope of the discrimination curve of FIG. 4, and if the oscillation frequency is on the shorter wavelength side, then controlling circuit 2 is selected so that temperature control by temperature monitoring circuit 21 is performed. Here, reference voltage 23 is set to a value which corresponds to a sufficiently longer wavelength than the longer wavelength side slope of the wavelength discrimination curve of FIG. 4. Consequently, current flows through Peltier element 33 in a heating direction, and the temperature of laser diode module 3 rises and the wavelength of laser diode module 3 is displaced to the longer wavelength side of the slope. Thereafter, the selection is switched from controlling circuit 2 to controlling circuit 1 so that control in which the wavelength discrimination characteristic of the optical band-pass filter is performed to lock the oscillation frequency to 1,555.5 nm.

If the wavelength of laser diode module 3 is on the longer wavelength side of the slope, controlling circuit 1 is selected so that the oscillation frequency is locked to 1,555.5 nm by control in which the wavelength discrimination characteristic is used. The switching between controlling circuits 1, 2 is performed by analog switch 5.

Figure 5:
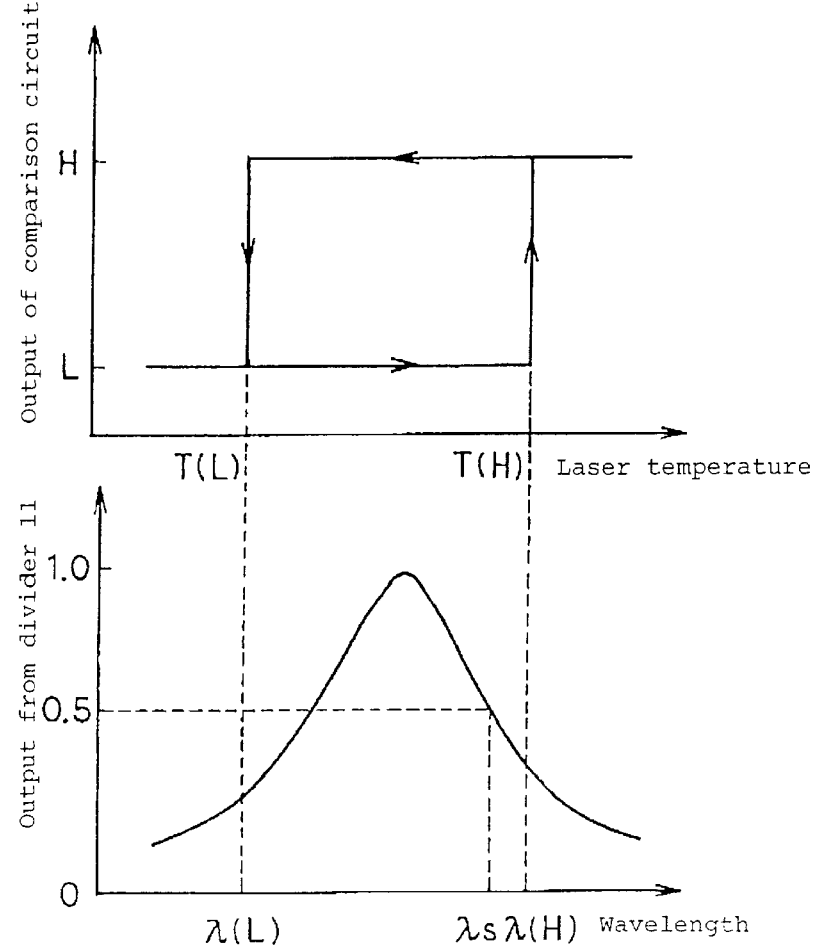
FIG. 5 is a graph illustrating switching control of an analog switch in the embodiment of the wavelength controlling circuit for a laser signal according to the present invention.

Next, a switching operation of analog switch 5 is described. Switching control of analog switch 5 is performed by comparison circuit 6. Comparison circuit 6 receives a voltage proportional to a monitoring result of temperature monitoring circuit 21 and generates an activation signal with a predetermined threshold voltage to switch analog switch 5. Comparison circuit 6 is a function generator of a variable threshold voltage having a hysteresis characteristic. The threshold value of comparison circuit 6 has a hysteresis width. The hysteresis width is set such that, as seen in FIG. 5, temperature T(H) of the laser at which switching from controlling circuit 2 to controlling circuit 1 should be performed is set to the longer wavelength side with respect to a temperature corresponding to a wavelength to be locked and laser temperature T(L) at which switching from controlling circuit 1 to controlling circuit 2 should be performed is set to the shorter wavelength side with respect to a center wavelength of the discrimination curve. Consequently, after the output from comparison circuit 6 changes over to "High" once, before the output from comparison circuit 6 changes over to "Low", the oscillation frequency of laser diode module 3 is locked by controlling circuit 1.

Figure 6:
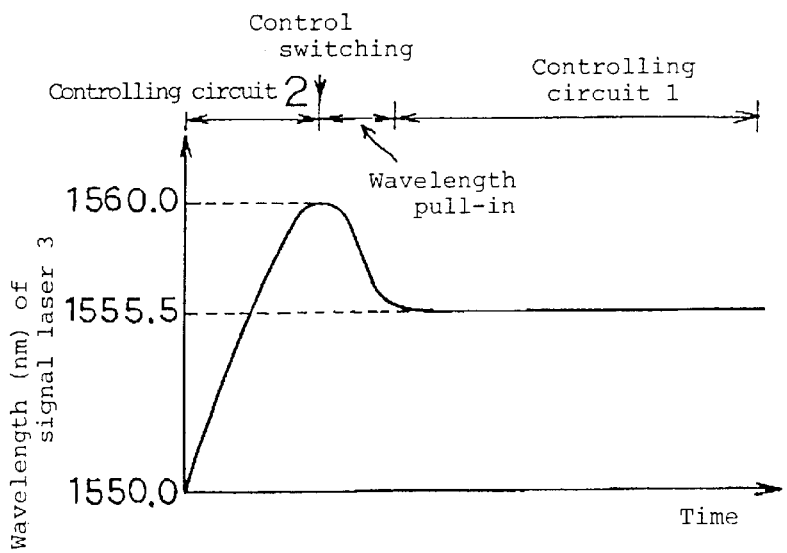
FIG. 6 is a graph illustrating a procedure of operation of the embodiment of the wavelength controlling circuit for a laser signal according to the present invention.

A detailed procedure of operation where the wavelength of laser diode module 3 when power supply is made available is on the shorter wavelength side of the slope is illustrated in FIG. 6. After power supply is made available, since analog switch 5 is connected to controlling circuit 2 side and current flows through Peltier element 33 in a heating direction, the wavelength of laser diode module 3 is pulled up to the longer wavelength side. After the wavelength of laser diode module 3 is pulled up to 1,560.0 nm, the output from comparison circuit 6 changes over to "High", and analog switch 5 is switched to controlling circuit 1 side. The wavelength of laser diode module 3 is pulled in to the locking wavelength side by the wavelength discrimination characteristic of controlling circuit 1 and is locked to the wavelength of 1,555.5 nm.

What is claimed is:

1. A wavelength controlling circuit controlling a wavelength of a laser signal, comprising:

a laser diode module including a semiconductor laser diode, a temperature detection element and a temperature adjustment element;

first wavelength controlling means including an optical band-pass filter used as a wavelength discrimination element discriminating the wavelength of the laser signal, adjusting the temperature adjustment element to control the wavelength of the laser signal within a range of fine adjustment within which the wavelength can be discriminated by said optical band-pass filter; and second wavelength controlling means for adjusting the temperature adjustment element, when the wavelength of the laser signal is outside the range within which the wavelength can be discriminated with a wavelength discrimination characteristic by said optical band-pass filter, to adjust the wavelength of the laser signal roughly so that the wavelength may be included in the range within which the wavelength can be discriminated by said optical band-pass filter.

2. A wavelength controlling circuit as claimed in claim 1, wherein said first wavelength controlling means for controlling the wavelength within the range of fine adjustment includes:

monitoring means including an element which branches part of a laser signal output from said semiconductor laser diode and a wavelength discrimination element monitoring the wavelength of the laser signal; and first adjustment means for generating a signal finely adjusting the temperature adjusting element to finely adjust the wavelength of the laser signal in response to an output from said monitoring means.

3. A wavelength controlling circuit as claimed in claim 2, wherein said monitoring means for monitoring the wavelength of the laser signal includes:

an element branching part of the laser signal output from said semiconductor laser diode; and a wavelength monitoring circuit including a beam splitter splitting the branched laser signal into two laser signals, an optical band-pass filter having a different transmission factor of an optical wavelength receiving one of the split laser signals, a first optical detector receiving the laser signal having transmitted through said optical band-pass filter, and a second optical detector for receiving the other of the split laser signals.

4. A wavelength controlling circuit as claimed in claim 3, wherein said first adjustment means for generating a signal fmely adjusting the wavelength of the laser signal in response to an output from said monitoring means is a first controlling circuit which includes:

a divider dividing an output from said first optical detector by an output from said second optical detector; and a first amplifier amplifying a difference voltage between an output signal from said divider and a first reference voltage.

5. A wavelength controlling circuit controlling a wavelength of a wavelength signal, comprising:

a laser diode including a semiconductor laser diode, a temperature detection element and a temperature adjustment element;

monitoring means including an element which branches part of a laser signal output from said semiconductor laser diode and a wavelength discrimination element monitoring the wavelength of the laser signal;

first adjustment means for generating a signal finely adjusting the wavelength of the laser signal in response to an output from said monitoring means;

second adjustment means for generating a signal roughly adjusting the wavelength of the laser signal in response to a result of monitoring of the temperature which is monitored by said temperature detection element of said laser diode module;

switching means for discriminating, in response to the result of the temperature monitoring of said laser diode module, that a predetermined wavelength is reached and performing switching from said second adjustment means to said first adjustment means; and driving means for driving said temperature adjustment element of said laser diode module with the adjustment signals of said first and second adjustment means.

6. A wavelength controlling circuit as claimed in claim 5, wherein said monitoring means for monitoring the wavelength of the laser signal includes:

an element branching part of the laser signal output from said semiconductor laser diode; and a wavelength monitoring circuit including a beam splitter splitting the branched laser signal into two laser signals, an optical band-pass filter having a different transmission factor of an optical wavelength receiving one of the split laser signals, a first optical detector receiving the laser signal having transmitted through said optical band-pass filter, and a second optical detector receiving the other of the split laser signals.

7. A wavelength controlling circuit as claimed in claim 6, wherein said first adjustment means for generating a signal finely adjusting the wavelength of the laser signal in response to an output from said monitoring means is a first controlling circuit which includes:

a divider dividing an output from said first optical detector by an output from said second optical detector; and a first amplifier amplifying a difference voltage between an output signal from said divider and a first reference voltage.

8. A wavelength controlling circuit as claimed in claim 5, wherein said second adjustment means for generating a signal for roughly adjusting the wavelength of the laser signal in response to a result of the monitoring is a second controlling circuit which includes:

a temperature monitoring circuit connected to a thermistor of said laser diode module detecting a voltage signal proportional to the temperature; and a second amplifier amplifying a difference between an output from said temperature monitoring circuit and a second reference voltage.

9. A wavelength controlling circuit for a laser signal as claimed in claim 5, wherein said switching means for performing switching from said second adjustment means to said first adjustment means is a switching circuit which includes:

a comparison circuit receiving a voltage proportional to the monitoring result of the temperature and generating an activation signal with a predetermined voltage; and a switch which operates in response to the activation signal of said comparison circuit.

10. A wavelength controlling circuit as claimed in claim 9, wherein said comparison circuit is a function generator of a variable rising apply voltage having a hysteresis characteristic.

11. A wavelength controlling circuit controlling a wavelength signal, comprising:

a laser diode including a semiconductor laser diode, a temperature detection element and a temperature adjustment element;

an element branching part of a laser signal output from said semiconductor laser diode;

a wavelength monitoring circuit including a beam splitter splitting the branched laser signal into two laser signals, an optical band-pass filter having a different transmission factor of an optical wavelength receiving one of the split laser signals, a first optical detector receiving the laser signal having transmitted through said optical band-pass filter, and a second optical detector receiving the other of the split laser signals, said wavelength monitoring circuit monitoring a range within which the wavelength of the laser signal can be discriminated by said optical band-pass filter;

a first controlling circuit generating a signal finely adjusting the wavelength of the laser signal, said first controlling circuit including a divider dividing an output from said second optical detector of said wavelength monitoring circuit by an output from said first optical detector and a first amplifier amplifying a difference voltage between an output signal from said divider and a first reference voltage;

a second controlling circuit generating a signal roughly adjusting the wavelength of the laser signal so that the wavelength of the laser signal may come within a discrimination allowing range, said second controlling circuit including a temperature monitoring circuit connected to a thermistor of said laser diode module detecting a voltage signal proportional to the temperature after operation is started and a second amplifier amplifying a difference between an output from said temperature monitoring circuit and a second reference voltage;

a switching circuit performing switching from said second controlling circuit which roughly adjusts the wavelength of the laser signal to said first controlling circuit which finely adjusts the wavelength of the laser signal, said switching circuit including a comparison circuit receiving the voltage proportional to the temperature by the rough adjustment of the wavelength of the laser signal and generating an activation signal with a predetermined voltage and a switch which operates in response to the activation signal of said comparison circuit; and a driving circuit driving said temperature adjustment element of said laser diode module with the fine adjustment signal of said first controlling circuit.

* * * * *